United States Patent [19]

Kagawa et al.

[11] Patent Number: 5,079,185
[45] Date of Patent: Jan. 7, 1992

[54] METHOD OF MAKING A SEMICONDUCTOR LASER

[75] Inventors: Hitoshi Kagawa; Tetsuya Yagi, both of Itami, Japan

[73] Assignee: Mitsubishi Denki Kabushiki Kaisha, Japan

[21] Appl. No.: 597,782

[22] Filed: Oct. 10, 1990

Related U.S. Application Data

[62] Division of Ser. No. 387,767, Aug. 1, 1989, Pat. No. 4,984,243.

[30] Foreign Application Priority Data

Apr. 6, 1989 [JP] Japan .................. 1-88708

[51] Int. Cl.$^5$ ................................ H01L 21/20
[52] U.S. Cl. ......................... 437/129; 437/130; 437/133; 148/DIG. 72; 148/DIG. 95
[58] Field of Search ............ 437/129, 130, 133; 148/DIG. 95, DIG. 72

[56] References Cited

U.S. PATENT DOCUMENTS

| | | | |
|---|---|---|---|
| 4,178,604 | 12/1979 | Nakamura et al. | 437/129 |
| 4,734,385 | 3/1988 | Mihashi et al. | 437/129 |
| 4,782,035 | 11/1988 | Fujiwara | 437/129 |
| 4,829,023 | 5/1989 | Nagai et al. | 437/129 |
| 4,847,857 | 7/1989 | Ohkura | 372/96 |
| 4,855,250 | 8/1989 | Yamamoto et al. | 148/DIG. 72 |

FOREIGN PATENT DOCUMENTS

| | | | |
|---|---|---|---|
| 103393 | 6/1984 | Japan | 437/129 |
| 229889 | 12/1984 | Japan | 437/129 |
| 60-66484 | 4/1985 | Japan | |

OTHER PUBLICATIONS

Luo et al., "Fabrication and . . . Laser Diode", . . . Conference on Solid State Devices . . . , Tokyo, 1988, pp. 327–330.
Takigawa et al., "Continuous Room-Temperature . . . Laser", Applied Physics Letters, 51 (20), 1987, pp. 1580–1581.

Primary Examiner—Brian E. Hearn
Assistant Examiner—Linda J. Fleck
Attorney, Agent, or Firm—Leydig, Voit & Mayer

[57] ABSTRACT

A semiconductor laser includes a groove in a GaAs first current blocking layer, which extends to an $Al_xGa_{(1-x)}As$ second clad layer beneath the first blocking layer. The width of the groove periodically changes along the length of the resonator. Over the regions of the first current blocking layer where the groove has a smaller width, a $Al_zGa_{(1-z)}As$ second current blocking grating layer is formed. An $Al_xGa_{(1-x)}As$ third current blocking layer is disposed on the second current blocking layer and the portions of the first current blocking layer not covered by the second current blocking layer. The variation of the width of the groove is achieved by selective etching in gaseous hydrogen chloride by irradiation with an arsenic molecular beam, or by placing a liquid-phase solvent.

6 Claims, 7 Drawing Sheets

METHOD OF MAKING A SEMICONDUCTOR LASER

This application is a division of application Ser. No. 07/387,767, filed Aug. 1, 1989 now U.S. Pat. No. 4,984,243.

The present invention relates to an AlGaAs semiconductor laser device and, more particularly, to a gain-coupled type semiconductor laser device and a method of making such a laser device.

BACKGROUND OF THE INVENTION

In FIG. 1a, there is shown a conventional index-coupled type, distributed feedback (DFB) semiconductor laser device that is shown, for example, in Japanese Patent Publication No. SHO 60-66484 laid open to public inspection on Apr. 16, 1985. The laser device of FIG. 1a comprises an N-type GaAs substrate 21, a first cladding layer 22 of N-type $Al_{0.4}Ga_{0.6}As$ formed on the substrate 21, an intrinsic (I) $Al_{0.1}Ga_{0.9}As$ active layer 23 formed on the first cladding layer 22, a P-type $Al_{0.25}Ga_{0.75}As$ beam guide layer 24 formed on the active layer 23, and an N-type GaAs current blocking layer 25 formed on the beam guide layer 24. As will be described later with reference to FIG. 1b, corrugations 31 and 32 each comprising periodically repeating ridges are formed, by etching, in the upper surface portion of the P-type $Al_{0.25}Ga_{0.75}As$ beam guide layer 24, in a groove 30 in the N-type GaAs current blocking layer 25 and in the upper surface of the current blocking layer 25, respectively. A second cladding layer 26 of P-type $Al_{0.4}Ga_{0.6}As$ is formed over the groove 30 to fill it and also over the upper surface of the N-type GaAs current blocking layer 25. Over the second cladding layer 26, is formed a P-type GaAs contact layer 27. An electrode layer 28 of, for example, Cr/Au overlies the P-type GaAs contact layer 27. An electrode layer 29 of, for example, Au-Ge/Au is formed to cover the bottom surface of the N-type GaAs substrate 21.

This semiconductor laser device is fabricated in a manner stated below. For example, an MOCVD (metal-organic chemical vapor deposition) technique is employed to successively grow, on the N-type GaAs substrate 21, the N-type $Al_{0.4}Ga_{0.6}As$ first cladding layer 22, the intrinsic $Al_{0.1}Ga_{0.9}As$ active layer 23, the P-type $Al_{0.25}Ga_{0.75}As$ beam guide layer 24 and the N-type GaAs current blocking layer 25. Next, referring to FIG. 1b, a photoresist layer is formed over the current blocking layer 25, and is exposed to a pattern of laser light, using a two-beam interference exposure technique, to thereby form a predetermined periodic striped pattern in the photoresist layer. Next, the current blocking layer 25 is etched by the reactive ion etching technique, with the stripe-patterned photoresist layer used as a mask, whereby the corrugation 32 comprising periodically repeating ridges is formed in the current blocking layer 25. After that, a photoresist mask is formed over the current blocking layer 25, and the groove 30 of a predetermined width is formed to extend in the direction perpendicular to the direction of extension of the ridges. The conditions for this etching are determined such that the etching advances vertically but etching from the sides of the ridges is prevented. Then, the periodic stripe pattern in the N-type GaAs current blocking layer 25 is retained during the etching and, ultimately, it is transferred to the surface of the the P-type $Al_{0.25}Ga_{0.75}As$ beam guide layer 24.

Thereafter, the photoresist is removed and the surface of the structure is cleaned. The MOCVD technique is again used to successively grow the P-type $Al_{0.4}Ga_{0.6}As$ second cladding layer 26 and the P-type GaAs contact layer 27. Then, the Cr/Au electrode layer 28 and the Au-Ge/Au electrode layer 29 are deposited over the contact layer 27 and the bottom surface of the substrate 21, respectively.

Next, operation of the above-stated index-coupled type semiconductor laser device is described. The electrode layers 28 and 29 are connected respectively to the positive and negative terminals of a bias source (not shown). Then, current flows through the semiconductor laser so that carriers injected into the intrinsic $Al_{0.1}Ga_{0.9}As$ active layer 23 recombine, whereby light is emitted. As the injection current level is increased, stimulated emission begins, and, ultimately, laser oscillation results. Part of laser light is guided into the P-type $Al_{0.25}Ga_{0.75}As$ beam guide layer 24. The period $\Lambda$ of the ridges in the corrugation 31 in the surface of the beam guide layer 24 in the groove 30 is determined to be, $$\Lambda = m \cdot \lambda_0 / 2N_r \tag{1}$$

where:
  m is a positive integer;
  $N_r$ is an index of refraction of the beam guide path; and
  $\lambda_0$ is an oscillation wavelength.

Then, only light of the wavelength $\lambda_0$ is selected and, accordingly, single longitudinal mode oscillation results.

During the manufacturing of the above described conventional AlGaAs index-coupled type DFB semiconductor laser device, the P-type $Al_{0.25}Ga_{0.75}As$ beam guide layer 24 is exposed to i.e., during the photoresist removal and surface cleaning treatments. Since the beam guide layer 24 contains Al, the surface of the beam guide layer 24 is oxidized. The P-type $Al_{0.4}Ga_{0.6}As$ second cladding layer 26 is then formed through crystal growth over the corrugation 31 of the P-type $Al_{0.25}Ga_{0.75}As$ beam guide layer 24, the surface of which has been oxidized. This results in a number of crystal defects in the vicinity of the hetero-interface between them, which degrades the crystallinity of the layers. Such crystal defects tend to increase during the operation of the semiconductor laser device, which shortens the life of the device.

There is another type of DFB semiconductor laser device, namely, a gain-coupled type DFB semiconductor laser device. An example of the gain-coupled type DFB semicondutor laser device is shown in FIGS. 2a and 2b. This laser device comprises an N-type GaAs substrate 41, an N-type $Al_{0.40}Ga_{0.60}As$ first cladding layer 42 formed over the substrate 41, a P-type GaAs active layer 43 overlying the first cladding layer 42, a P-type $Al_{0.25}Ga_{0.75}As$ carrier confining layer 44 overlying the active layer 43, and a P-type GaAs beam guide layer 45 formed to overlie the carrier confining layer 44. As shown in FIG. 2b, corrugation 51 comprising periodically repeating ridges repeating with a period $\Lambda$ is formed in the surface of the P-type GaAs beam guide layer 45. Overlying the corrugated P-type GaAs beam guide layer 45, a P-type $Al_{0.40}Ga_{0.60}As$ second cladding layer 46 is formed, which in turn is overlain by a P-type GaAs contact layer 47. This device also includes electrode layers 48 and 49 similar to the ones used in the semiconductor laser device shown in FIG. 1a.

The gain-coupled type DFB semiconductor laser device shown in FIGS. 2a and 2b oscillates in the single longitudinal mode, when the electrode layers 48 and 49 are connected to positive and negative terminals, respectively, of a bias voltage source, which causes current to flow through the semiconductor laser device. By selecting the value in accordance with the aforementioned equation (1) for the period Λ of the corrugation 51, only light of the wavelength $\lambda_0$ is selected, and the device oscillates in the single longitudinal mode at the wavelength $\lambda_0$.

When the gain-coupled type DFB semiconductor laser device shown in FIGS. 2a and 2b is fabricated, the corrugation 51 is formed in the P-type GaAs beam guide layer 45, and, therefore, the surface exposed to air during the manufacturing is the upper surface of the P-type GaAs beam guide layer 45 which does not contain Al. Since spontaneous oxidation of the surface of the layer 45 is limited, the number of crystal defects at the re-grown heterointerface as compared to the aforementioned index-coupled type DFB semiconductor laser device is less. Accordingly, this gain-coupled type DFB semiconductor laser device has no degradation of reliability or shortening of life caused by the degradation of the crystallinity. However, this device has other problems. That is, since the P-type GaAs beam guide layer 45 itself absorbs laser light, the internal loss within the laser resonator is large so that the laser device tends to have an increased laser oscillation threshold current, a decreased quantum efficiency.

An object of the present invention is to provide an AlGaAs semiconductor laser device, in particular, an AlGaAs gain-coupled type DFB semiconductor device which is free of the above-stated various problems and has a low oscillation threshold current high quantum efficiency, high reliability and a long life. The present invention also provides a method of fabricating such a semiconductor laser device.

SUMMARY OF THE INVENTION

A semiconductor laser device according to the present invention comprises a first conductivity-type GaAs substrate, a first conductivity-type $Al_xGa_{(1-x)}As$ first cladding layer formed over the substrate, a first or second conductivity-type or intrinsic $Al_yGa_{(1-y)}As$ active layer formed over the first cladding layer, a second conductivity-type $Al_xGa_{(1-x)}As$ second cladding layer formed over the active layer, and a first or second conductivity-type or intrinsic GaAs first current blocking layer formed over the second cladding layer. The first current blocking layer has a groove formed therein extending to the second cladding layer. The width of the groove changes between broader and narrower widths with a predetermined period along the longitudinal direction of a resonator. The semiconductor laser device according to the present invention further includes a first or second conductivity-type or intrinsic, $Al_zGa_{(1-z)}As$ second current blocking layer grating comprising stripes extending transverse to the length of the resonator on those regions of the first current blocking layer where the groove formed in the first current blocking layer has the narrower width, a first conductivity-type GaAs third current blocking layer formed over said second current blocking layer and the portions of said first current blocking layer which are free of said second current blocking layer, a second conductivity-type $Al_xGa_{(1-x)}As$ third cladding layer formed to fill the groove in said first current blocking layer and also to cover the surface of said third current blocking layer, and a second conductivity-type GaAs contact layer formed over said third clad layer.

A first method of fabricating a semiconductor laser device according to the present invention comprises the steps of: (1) epitaxially growing successively a first conductivity-type $Al_xGa_{(1-x)}As$ first cladding layer on a first conductivity-type GaAs substrate, a first or second conductivity type or intrinsic $Al_yGa_{(1-y)}As$ active layer on the first clad layer, a second conductivity-type $Al_xGa_{(1-x)}As$ second cladding layer on the active layer, a first or second conductivity-type or intrinsic GaAs first current blocking layer on the second cladding layer, and a first or second conductivity-type or intrinsic $Al_zGa_{(1-z)}As$ layer, on the first current blocking layer, for providing a second current blocking layer; (2) forming a photoresist grating over the $Al_zGa_{(1-z)}As$ layer for providing the second current blocking layer; (3) selectively etching the $Al_zGa_{(1-z)}As$ layer with the photoresist grating as an etching mask to thereby form an $Al_zGa_{(1-z)}As$ second current blocking grating; (4) epitaxially growing a first conductivity-type GaAs third current blocking layer to fill the spaces between the stripes of the second current blocking grating; (5) forming a groove in the third current blocking layer extending transverse to the strips of the second current blocking layer, the groove extending to the first current blocking layer; (6) placing the body with the thus formed groove in an apparatus for growing crystals through metalorganic chemical vapor deposition, and heating the body, while causing hydrogen chloride to flow in the apparatus, to thereby etch and remove the first current blocking layer portion exposed at the bottom the groove, and also to etch portions of the first current blocking layer with the stripes of the grating-shaped second current blocking layer as an etching mask, whereby the width of the groove in the first current blocking layer changes between smaller and larger widths with a predetermined period along the length of the groove (the third current blocking layer being also similarly etched to change the width of the groove in the third current blocking layer in this step); and (7), after the step (6), in the same crystal growing apparatus, successively epitaxially growing by a metal-organic chemical vapor deposition technique a second conductivity-type $Al_xGa_{(1-x)}As$ third cladding layer to fill the changing-width groove formed by the hydrogen chloride etching and to cover the surface of the third current blocking layer, and a second conductivity-type GaAs contact layer.

A second method of making the semiconductor laser device according to the present invention comprises the steps, following the steps (1) through (5) of the first embodiment, of (6') placing the wafer with the groove formed therein in a molecular beam epitaxial deposition apparatus, irradiating the wafer with an arsenic molecular beam, while heating the wafer, and thereby etch to remove the first current blocking layer portion exposed at the bottom of the groove, and to etch portions of the first current blocking layer with the stripes of the second current blocking layer used as an etching mask, whereby the width of the groove formed in the first current blocking layer changes between smaller and larger widths with a predetermined period (the third current blocking layer being also similarly etched to change the width of the groove in the third blocking layer in this step); and (7'), following the step (6'), in the same deposition apparatus, successively epitaxially growing by molecular beam epitaxy a second conductivity-type $Al_xGa_{(1-x)}As$ third cladding layer to fill the changing-width groove formed in the wafer and to cover the surface of the third current blocking layer, and a second conductivity-type GaAs contact layer.

According to a third method of making the semiconductor laser device of the present invention, following the steps (1) through (5) in the first embodiment, there are included the steps of (6") placing the wafer with the groove formed therein in a liquid-phase epitaxial deposition apparatus causing to pass over the wafer, a molten solvent which can selectively dissolve the first current blocking layer but not the second current blocking layer, to thereby remove the first current blocking layer portion exposed at the bottom of the groove through a melt-back process and to remove portions of the first current blocking layer with stripes of the second current blocking layer as a melt-back preventing layer, whereby the width of the groove formed in the first current blocking layer changes between smaller and larger widths with a predetermined period (portions of the third current blocking layer being also similarly melted back into the melt passing over the wafer, to change the width of the groove in the third current blocking layer); and (7"), after the step (6"), successively epitaxially growing, in the same liquid phase epitaxial deposition apparatus, a second conductivity-type $Al_xGa_{(1-x)}As$ third cladding layer to fill the changing-width groove in the first current blocking layer and to cover the surface of the third current blocking layer, and a second conductivity-type GaAs contact layer.

BRIEF DESCRIPTION OF THE DRAWINGS

FIG. 1b is a perspective view of part of the laser device of FIG. 1a;

FIG. 2b is a perspective view of part of the laser device of FIG. 1a;

DETAILED DESCRIPTION OF PREFERRED EMBODIMENTS

Figure 1A:
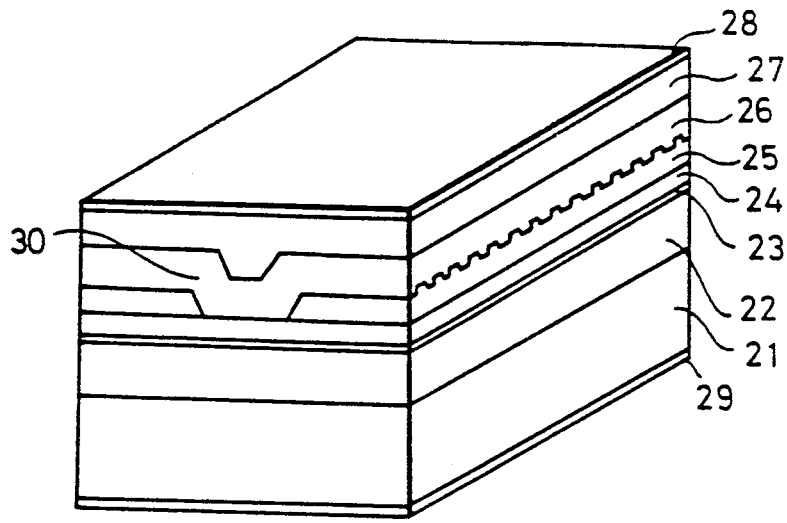
FIG. 1a is a perspective view of a conventional index-coupled type semiconductor laser device.
Figure 1B:
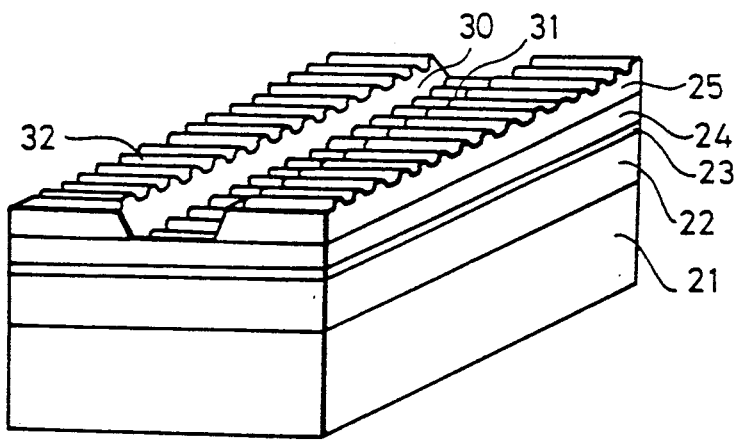
Figure 2A:
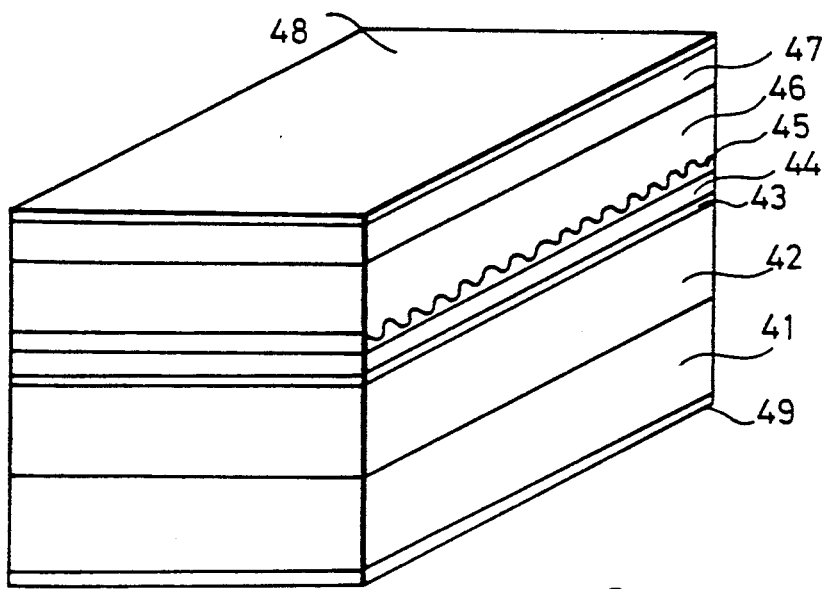
FIG. 2a is a perspective view of a conventional gain-coupled type semiconductor laser device.
Figure 2B:
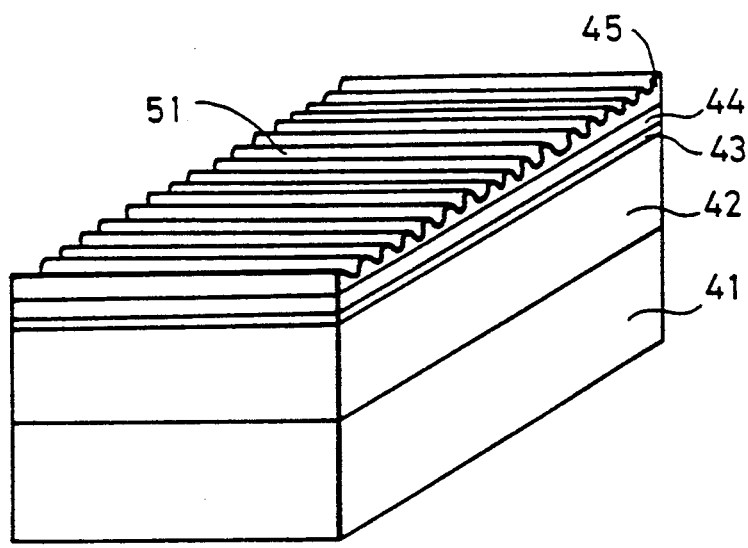
Figure 3A:
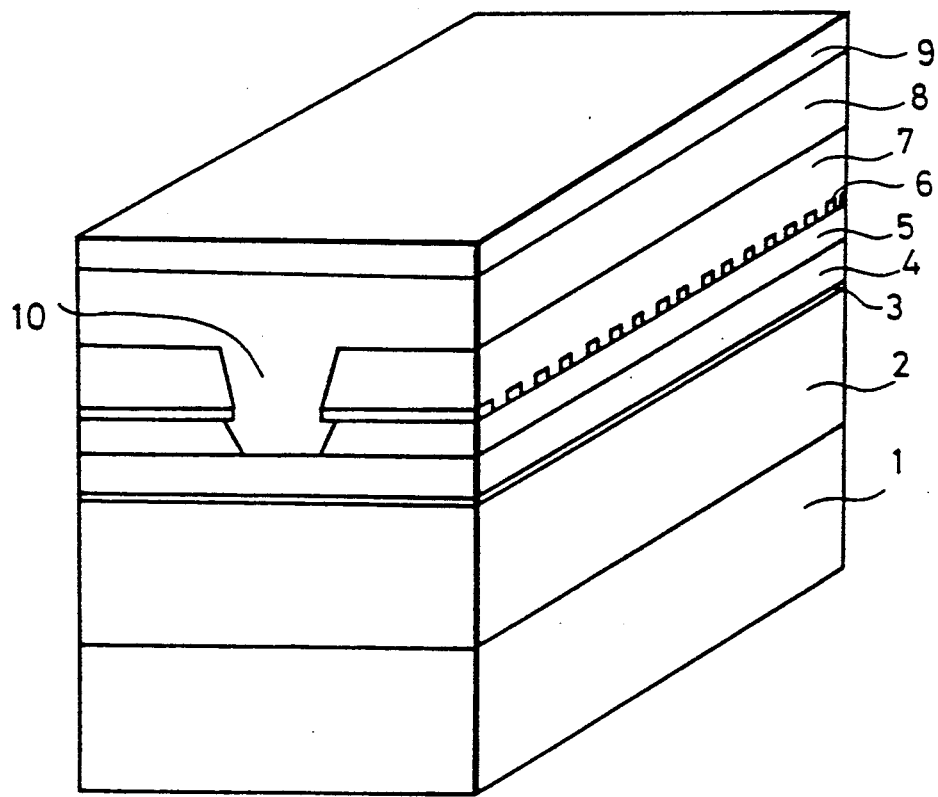
FIG. 3a is a perspective view of one embodiment of the gain-coupled type DFB semiconductor laser device according to the present invention.
Figure 3B:
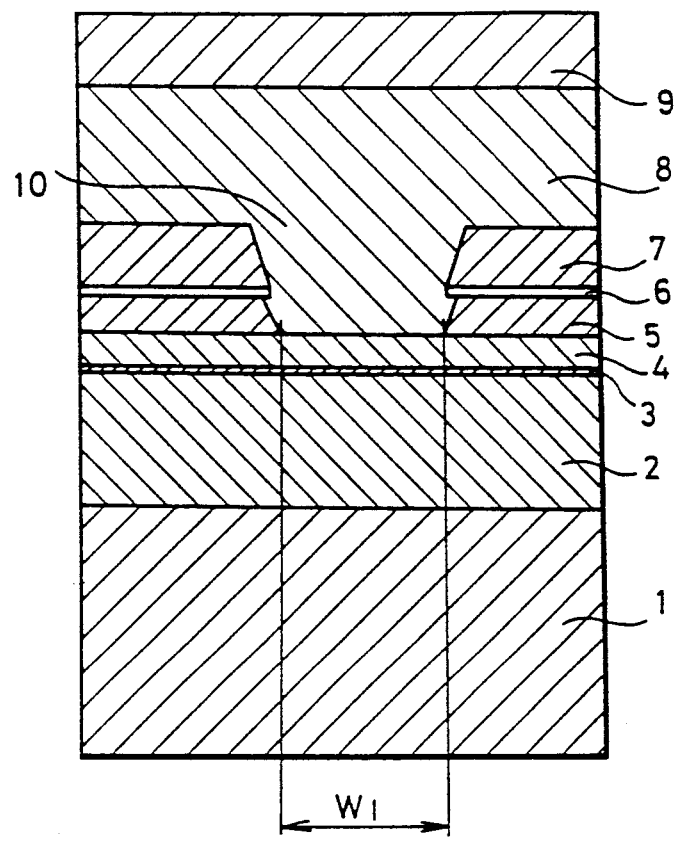
FIG. 3b is a cross-section of the semiconductor laser device shown in FIG. 3a taken at a location where a second current blocking layer is present.

FIG. 3a is a perspective view of a gain-coupled type DFB semiconductor laser device according to the present invention. The semiconductor laser device comprises, for example, an N-type GaAs substrate 1, an N-type $Al_{0.5}Ga_{0.5}As$ first cladding layer 2 disposed on the substrate 1, a P-type $Al_{0.15}Ga_{0.85}As$ active layer 3 on the first cladding layer 1, a P-type $Al_{0.5}Ga_{0.5}As$ second cladding layer 4 on the active layer 3, and an N-type GaAs first current blocking layer 5 on the second cladding layer 4. As shown in FIGS. 3a through 3d, on the regions of the first current blocking layer 5 where a groove 10 has a narrower width, an N-type $Al_{0.5}Ga_{0.5}As$ second current blocking layer is disposed as a grating having a predetermined period Λ (shown in FIG. 3d). As shown in FIG. 3b, which is a cross-section taken along the line X—X in FIG. 3d, the second current blocking layer 6 is disposed on the regions 11 in FIG. 3d where the corresponding portions of the groove 10 have a width $W_1$. An N-type GaAs third current blocking layer 7 is disposed on the second blocking layer 6 and also on the portion of the first current blocking layer 5 which is free of the second current blocking layer 6. P-type $Al_{0.5}Ga_{0.5}As$ is disposed, filling the groove 10 extending in the first, second and third current blocking layers 5, 6 and 7 and covering the surface of the third current blocking layer 7, forming a third cladding layer 8. A P-type GaAs contact layer 9 is disposed on this P-type $Al_{0.5}Ga_{0.5}As$ third clad layer 8.

Figure 3C:
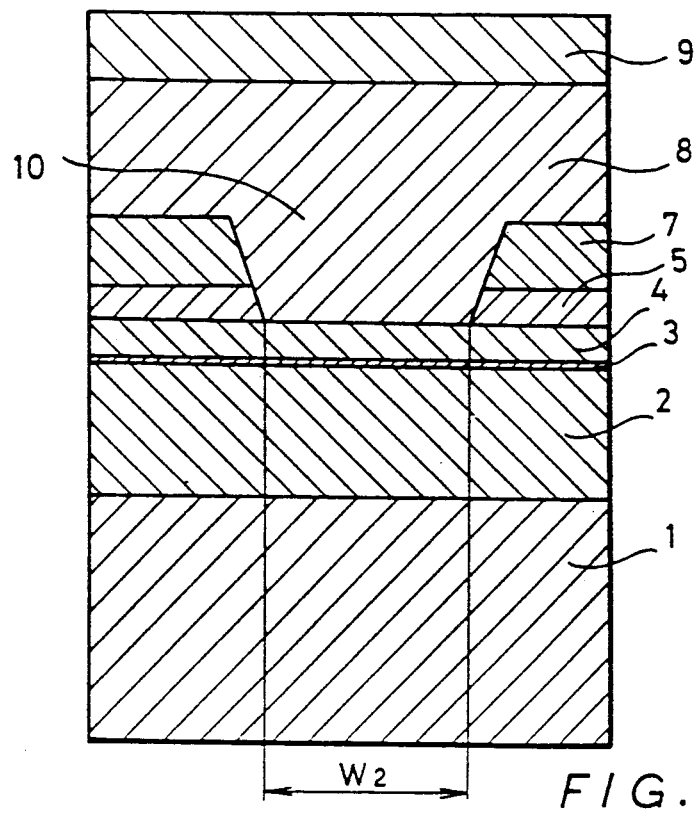
FIG. 3c is a cross-section of the semiconductor laser shown in FIG. 3a, taken at a location where the second current blocking layer is not present.
Figure 3D:
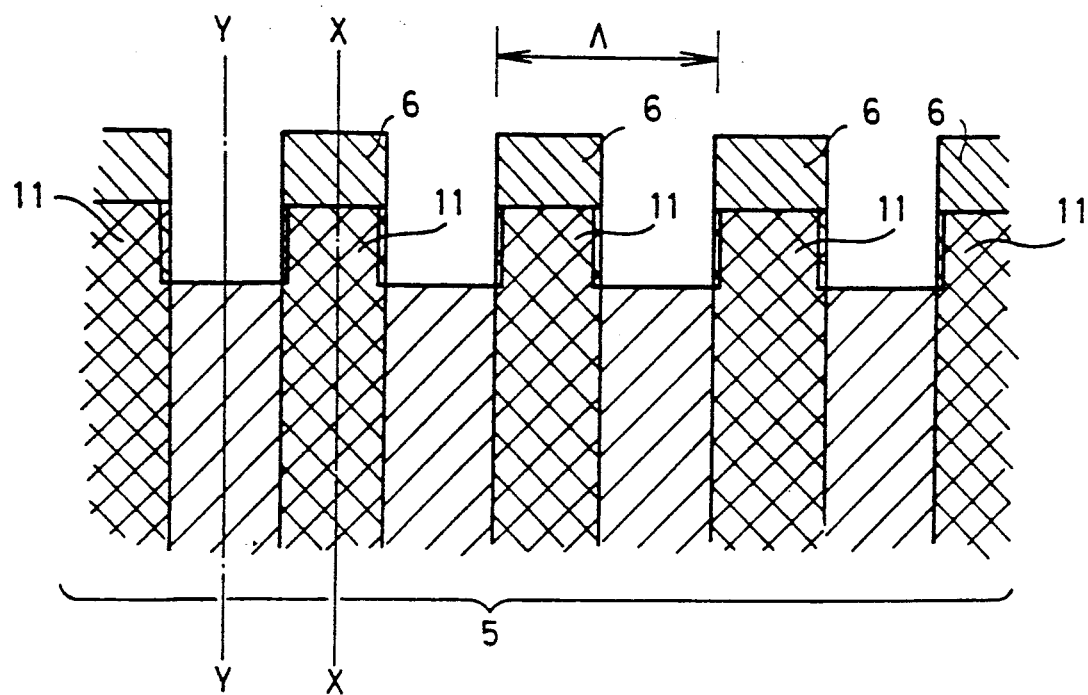
FIG. 3d shows on what portions of a first current blocking layer the second current blocking layer is in a laser device according to the invention.

Electrode layers are disposed on the P-type GaAs contact layer 9 and the N-type GaAs substrate 1, respectively. The electrode layer on the contact layer 9 is connected to the positive terminal of a bias source and the electrode layer on the substrate 1 is connected to the negative terminal. Then, current flows from the contact layer 9 toward the substrate 1 only through those regions of the device where the first, second and third current blocking layers 5, 6 and 7 are not present, that is, through the groove 10. Carriers injected into the P-type GaAs active layer by the current flow recombine and emit light. As the level of the injected current is increased stimulated emission begins and, then, the laser oscillation begins. Part of the laser light is guided into parts of the N-type $Al_{0.5}Ga_{0.5}As$ first cladding layer 2, the P-type $Al_{0.5}Ga_{0.5}As$ second cladding layer 4 and the P-type $Al_{0.5}Ga_{0.5}As$ third cladding layer 8. As shown in FIG. 3d, the width of the groove 10, which is formed through the first, second and third current blocking layers 5, 6 and 7 and which is filled with the material of the third cladding layer 8, changes alternately between $W_1$ (smaller width) of FIG. 3b and $W_2$ (larger width) of FIG. 3c showing the cross-section along Y—Y in FIG. 3d. The width changes with a period of Λ. Because of this arrangement the wavelength $\lambda_0$ expressed by the equation (1) is selected and the single longitudinal mode of oscillations results.

Next, referring to FIGS. 4a through 4g, the method of making the gain-coupled type DFB semiconductor laser device according to the present invention shown in FIGS. 3a through 3d is described.

EXAMPLE 1

Figure 4A:
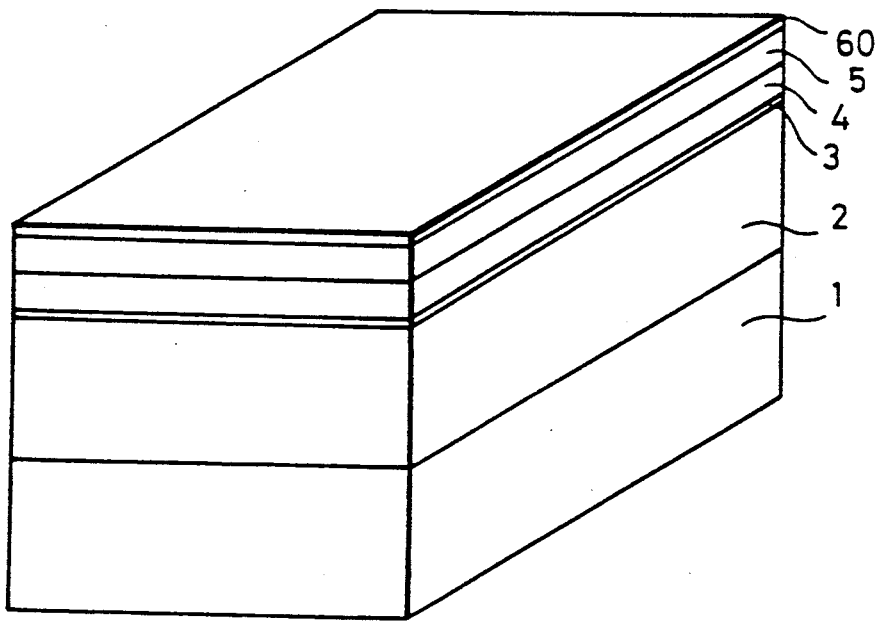
FIGS. 4a through 4g show various steps in the process of making a semiconductor laser device according to the present invention.
Figure 4B:
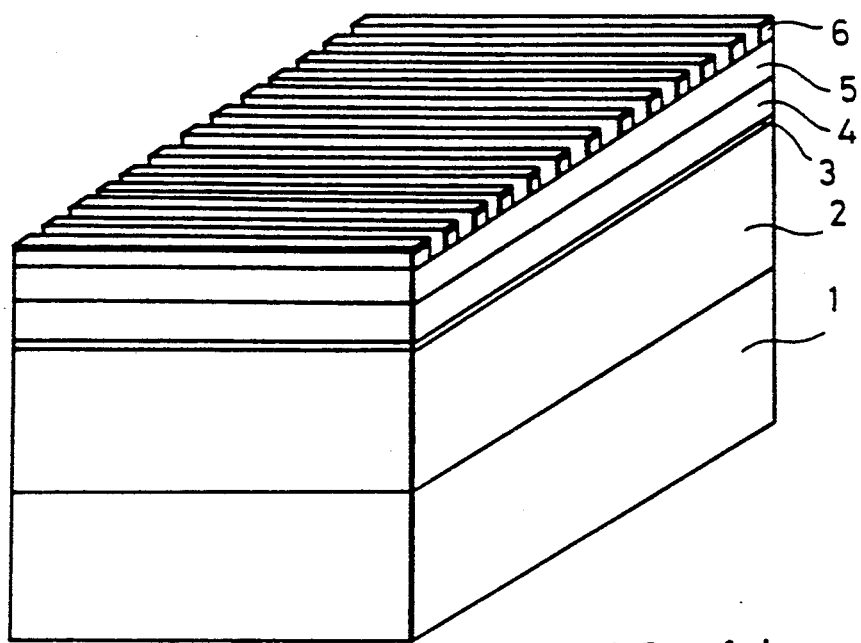

(1) As shown in FIG. 4a, by use of an epitaxial deposition technique, there are successively deposited, the N-type $Al_{0.5}Ga_{0.5}As$ first cladding layer 2 on the N-type GaAs substrate 1, the P-type $Al_{0.15}Ga_{0.85}As$ active layer 3 on the first cladding layer 2, the P-type $Al_{0.5}Ga_{0.5}As$ second cladding layer 4 on the active layer 3, the N-type GaAs first current blocking layer 5 on the second cladding layer 4, and a P-type $Al_{0.5}Ga_{0.5}As$ layer 60 to be formed into the second current blocking layer.

(2) Next, over the surface of the P-type $Al_{0.5}Ga_{0.5}As$ layer 60 shown in FIG. 4a, a photoresist grating is formed by means of, for example, a two-beam interference exposure technique. After that, the P-type Al$_{0.5}$Ga$_{0.5}$As layer 60 is selectively etched, using the photoresist grating as an etching mask, whereby the P-type Al$_{0.5}$Ga$_{0.5}$As second current blocking layer grating 6 is formed.

Figure 4C:
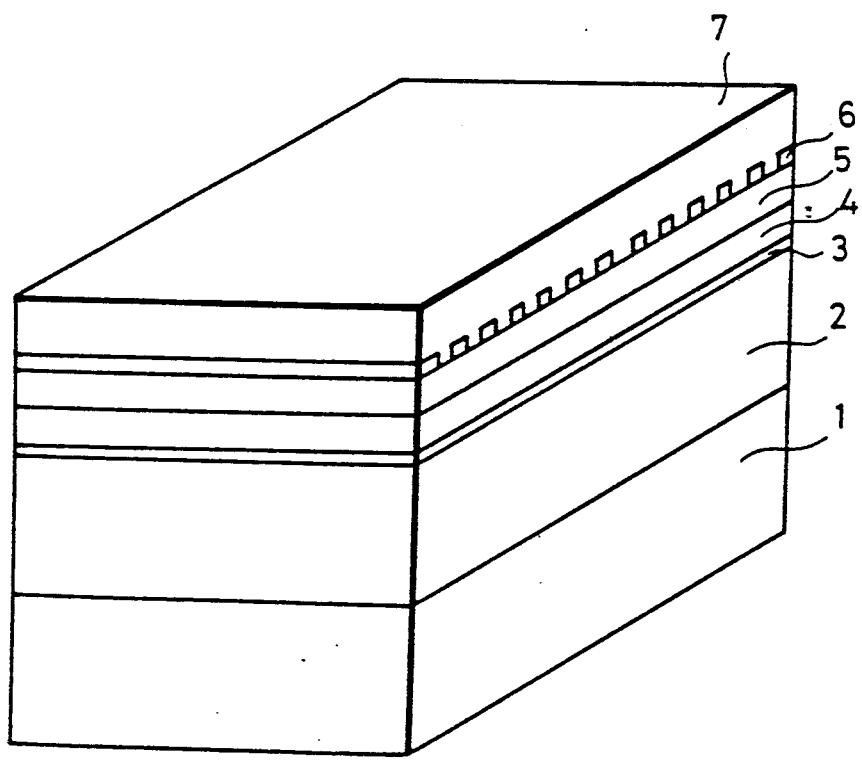

(3) Then, as shown in FIG. 4c, the N-type GaAs third current blocking layer 7 is epitaxially grown, filling the second current blocking layer grating 6.

(4) After that, a photoresist layer is formed on the third current blocking layer 7 shown in FIG. 4c for etching the groove 10 in the third current blocking layer 7 and in the second current blocking layer 6. The groove extends in the direction transverse to the grating stripes of the second current blocking layer grating 6 and also extends toward the first current blocking layer 5.

Figure 4D:
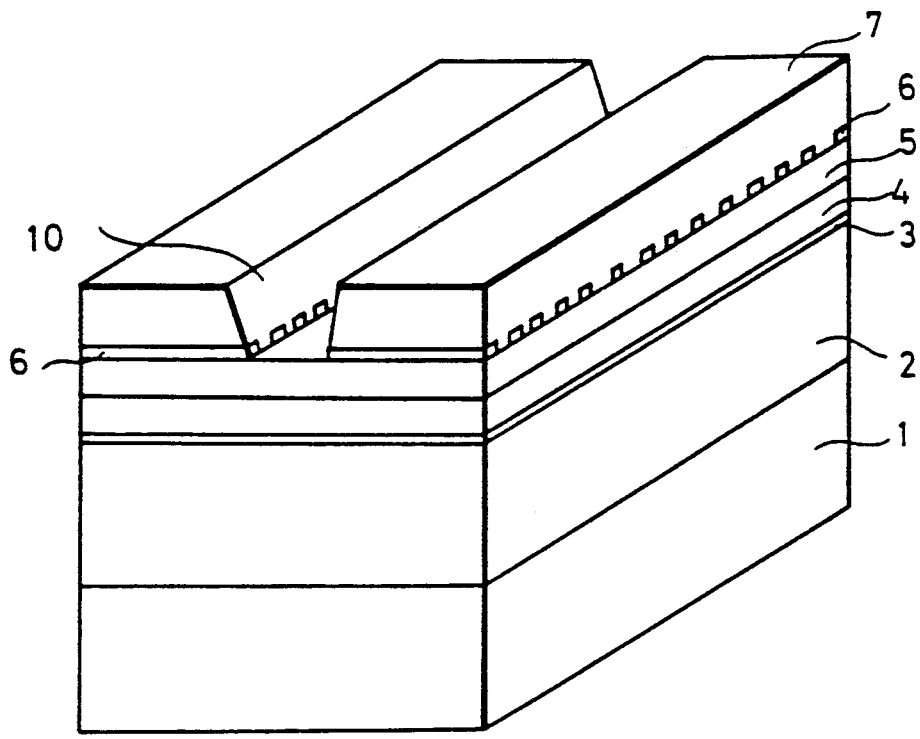
Figure 4E:
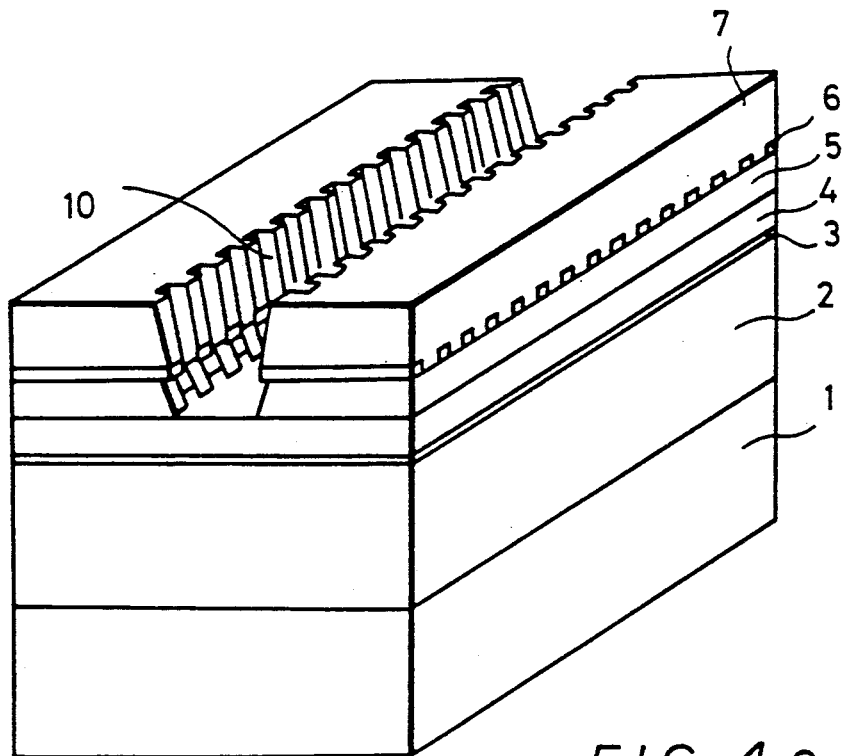
Figure 4F:
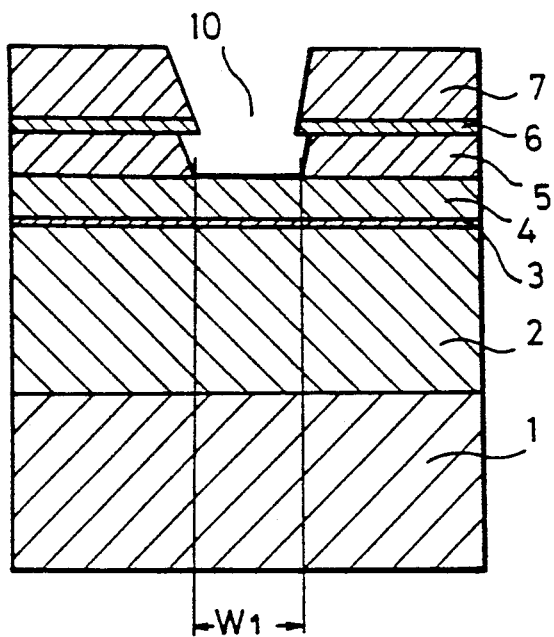
Figure 4G:
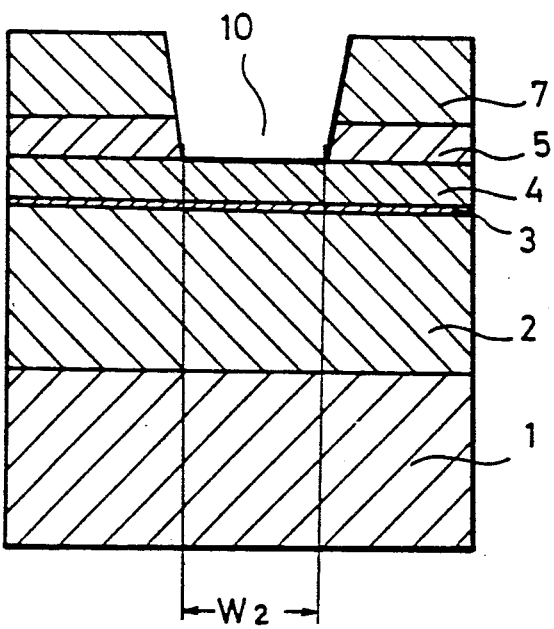

(5) Next, after the groove 10 has been formed as shown in FIG. 4d, the semiconductor body is placed in an apparatus for growing crystals by the metalorganic chemical vapor deposition process. The semiconductor wafer is heated and etched by flowing hydrogen chloride, so that the portion of the N-type GaAs first current blocking layer 5 exposed through the groove 10 is etched away. Also portions of the first current blocking layer 5 are etched away with the strips of the second current blocking layer grating 6 acting as an etching mask. As a result the groove 10 in the first current blocking layer 5 changes in width between smaller and larger widths with the predetermined period Λ in the longitudinal direction of the groove 10. In this etching step, portions of the third current blocking layer 7 are also similarly etched away to periodically change the width of the groove in the third current blocking layer 7. Thus, the structure as shown in FIG. 4e is produced. FIG. 4f shows a cross-section of the structure shown in FIG. 4e where a P-type Al$_{0.5}$Ga$_{0.5}$As second current blocking layer 6 grating stripe is present. As shown in FIG. 4f, the width of the groove at its bottom in these portions is W$_1$. FIG. 4g shows a cross-section of the structure shown in FIG. 4e where the P-type Al$_{0.5}$Ga$_{0.5}$As second current blocking layer 6 grating stripe is not present. The width of the groove 10 at its bottom in these portions is W$_2$ (W$_2$>W$_1$).

(6) Following the step (5), the P-type Al$_{0.5}$Ga$_{0.5}$As third cladding layer 8, which fills the groove 10 and covers the surface of the third current blocking layer 7, and the P-type GaAs contact layer 9 on the third cladding layer 8 are epitaxially grown by the metalorganic chemical vapor deposition process in the same crystal growing apparatus, whereby the semiconductor laser device shown in FIG. 3a is produced.

EXAMPLE 2

The steps (1) through (4) of Example 1 are followed.

(5') The semiconductor body with the groove 10 formed therein as shown in FIG. 4d is placed in an apparatus for growing crystals by molecular beam expitaxy. The semiconductor body is heated and irradiated with an arsenic molecular beam, so that the portion of the N-type GaAs first current blocking layer 5 exposed at the bottom of the groove 10 is etched away and also portions of the first current blocking layer 5 are also etched away with the stripes of the second current blocking layer grating 6 acting as an etching mask. Thereby, the groove 10 in the first current blocking layer 5 changes in width, alternating between smaller and larger widths with the predetermined period Λ in the longitudinal direction of the groove 10. In this etching step, portions of the third current blocking layer are also similarly etched away to periodically change the width of the groove in the third current blocking layer 7. Thus, the structure as shown in FIG. 4e is produced. As stated previously with reference to Example 1, FIG. 4f shows a cross-section of the structure shown in FIG. 4e where a P-type Al$_{0.5}$Ga$_{0.5}$As second current blocking layer 6 grating stripe is present. As shown in FIG. 4f, the width of the groove at its bottom in these portions is W$_1$. FIG. 4g shows a cross-section of the structure shown in FIG. 4e where the P-type Al$_{0.5}$Ga$_{0.5}$As second current blocking layer 6 grating stripe is not present. The width of the groove 10 at its bottom in these portions in W$_2$ (W$_2$>W$_1$).

(6') Following the step (5'), the P-type Al$_{0.5}$Ga$_{0.5}$As third cladding layer 8, which fills the groove 10 and covers the surface of the third current blocking layer 7, and the P-type GaAs contact layer 9 on the third cladding layer 8 are epitaxially grown by molecular beam epitaxy in the same crystal growing apparatus, whereby the semiconductor laser device shown in FIG. 3a results.

EXAMPLE 3

The steps (1)–(4) of Example 1 are performed.

(5") The semiconductor body having the groove 10 formed therein as shown in FIG. 4d is placed in a liquid-phase epitaxial deposition apparatus. A solvent which can dissolve the N-type GaAs first current blocking layer 5 and the N-type GaAs third current blocking layer 7 but cannot dissolve the P-type Al$_{0.5}$Ga$_{0.5}$As second current blocking layer 6 is passed over the wafer, whereby the portion of the N-type GaAs first current blocking layer 5 exposed at the bottom of the groove 10 is removed through a melt-back process. Portions of the N-type GaAs first current blocking layer 5 are removed with the strips of the Al$_{0.5}$Ga$_{0.5}$As second current blocking layer grating 6 acting as a dissolution preventing layer. Thereby the groove 10 in the first current blocking layer 5 changes in width, alternating between a smaller width and a larger width with the period Λ in the longitudinal direction of the groove 10. In this step, portions of the third current blocking layer 7 are also similarly removed through the melt-back process to periodically change the width of the groove in the third current blocking layer 7. Thus, the structure shown in FIG. 4e results. As in the case of Example 1. FIG. 4f shows a cross-section of the structure of FIG. 4e where the P-type Al$_{0.5}$Ga$_{0.5}$As second current blocking layer 6 grating stripe is present. There, the width of the groove at the bottom is W$_1$. FIG. 4g shows a cross-section of the structure of FIG. 4e where the P-type Al$_{0.5}$Ga$_{0.5}$As second current blocking layer 6 grating stripe is not present. There, the width of the groove at the bottom is W$_2$ (W$_2$>W$_1$).

(6") Following the step (5"), in the same crystal growing apparatus, the P-type Al$_{0.5}$Ga$_{0.5}$As third cladding layer 8, which fills the groove 10 and also covers the surface of the third current blocking layer 7, and the P-type GaAs contact layer 9 overlying the third current blocking layer 7 are successively epitaxially grown. Thus, the semiconductor laser device shown in FIG. 3a is completed.

In the gain-coupled type DFB semiconductor laser device according to the present invention, groove 10 is formed through the first through third current blocking layers 5, 6 and 7 extending in the longitudinal direction of the resonator. Accordingly, there is substantially no portion which would act as a laser-light absorber. Furthermore, according to the present invention, since the groove 10 has a width which changes in the longitudinal direction between smaller and larger widths with a predetermined period Λ, the resulting AlGaAs gain-coupled type DFB semiconductor laser device can provide the single longitudinal mode of oscillation at the wavelength $\lambda_0$ with a low threshold current and with a high quantum efficiency.

Furthermore, according to the method of making the semiconductor laser device of the present invention, during the step of removing portions of the first through third current blocking layers in order to form the varying-width groove and during the succeeding step of growing the third cladding layer and the contact layer, the surfaces of these layers are never exposed to air. Accordingly, there is no surface oxidation, and, therefore, the number of crystal defects at the re-grown heterointerface is greatly reduced relative to conventional devices, so that reliable, long-life semiconductor laser devices operable at low threshold current and at high quantum efficiency can be fabricated.

What is claimed is:

1. A method of making a semiconductor laser device comprising:

successively epitaxially growing a first conductivity-type $Al_xGa_{(1-x)}As$ first cladding layer on a first conductivity-type GaAs substrate, an $Al_yGa_{(1-y)}As$ active layer on said first cladding layer, a second conductivity-type $Al_xGa_{(1-x)}As$ second cladding layer on said active layer, a GaAs first current blocking layer on said second cladding layer, and an $Al_zGa_{(1-z)}As$ layer as a second current blocking layer as a semiconductor body;

forming a photoresist grating on said $Al_zGa_{(1-z)}As$ layer;

selectively etching said $Al_zGa_{(1-z)}As$ layer with said photoresist grating as an etching mask to form said $Al_zGa_{(1-z)}As$ second current blocking layer into a second current blocking layer grating having stripes;

epitaxially growing a first conductivity-type GaAs third current blocking layer on said first current blocking layer and on and burying said second current blocking layer grating;

forming a groove in said third current blocking layer extending in depth to said first current blocking layer and in length transverse to the second current blocking layer grating stripes;

heating the semiconductor body in gaseous hydrogen chloride to etch and remove the portion of said first current blocking layer at the bottom of the groove and portions of said first current blocking layer with said grating stripes as an etching mask whereby the width of the groove in said first current blocking layer changes periodically along the length of the groove; and successively epitaxially growing in a metalorganic chemical vapor deposition process a second conductivity-type $Al_xGa_{(1-x)}As$ third cladding layer, filling the groove and covering said third current blocking layer, and a second conductivity-type GaAs contact layer on said third cladding layer.

2. A method of making a semiconductor laser device comprising:

successively epitaxially growing a first conductivity-type $Al_xGa_{(1-x)}As$ first cladding layer on a first conductivity-type GaAs substrate, an $Al_yGa_{(1-y)}As$ active layer on said first cladding layer, a second conductivity-type $Al_xGa_{(1-x)}As$ second cladding layer on said active layer, a GaAs first current blocking layer on said second cladding layer, and an $Al_zGa_{(1-z)}As$ layer as a second current blocking layer as a semiconductor body;

forming a photoresist grating on said $Al_zGa_{(1-z)}As$ layer;

selectively etching said $Al_zGa_{(1-z)}As$ layer with said photoresist grating as an etching mask to form said $Al_zGa_{(1-z)}As$ second current blocking layer into a second current blocking layer grating having stripes;

epitaxially growing a first conductivity-type GaAs third current blocking layer on said first current blocking layer and on and burying said second current blocking layer grating;

forming a groove in said third current blocking layer extending in depth to said first current blocking layer and in length transverse to the second current blocking layer grating stripes;

heating the semiconductor body and irradiating it with an arsenic molecular beam to etch and remove the portion of said first current blocking layer at the bottom of the groove and portions of said first current blocking layer with said grating stripes as an etching mask whereby the width of the groove in said first current blocking layer changes periodically along the length of the groove; and successively epitaxially growing by molecular beam epitaxy a second conductivity-type $Al_xGa_{(1-x)}As$ third cladding layer, filling the groove and covering said third current blocking layer, and a second conductivity-type GaAs contact layer on said third cladding layer.

3. A method of making a semiconductor laser device comprising:

successively epitaxially growing a first conductivity-type $Al_xGa_{(1-x)}As$ first cladding layer on a first conductivity-type GaAs substrate, an $Al_yGa_{(1-y)}As$ active layer on said first cladding layer, a second conductivity-type $Al_xGa_{(1-x)}As$ second cladding layer on said active layer, a GaAs first current blocking layer on said second cladding layer, and an $Al_zGa_{(1-z)}As$ layer as a second current blocking layer as a semiconductor body;

forming a photoresist grating on said $Al_zGa_{(1-z)}As$ layer;

selectively etching said $Al_zGa_{(1-z)}As$ layer with said photoresist grating as an etching mask to form said $Al_zGa_{(1-z)}As$ second current blocking layer into a second current blocking layer grating having stripes;

epitaxially growing a first conductivity-type GaAs third current blocking layer on said first current blocking layer and on and burying said second current blocking layer grating;

forming a groove in said third current blocking layer extending in depth to said first current blocking layer and in length transverse to the second current blocking layer grating stripes;

placing said semiconductor body in a solvent and dissolving said first current blocking layer but not said second current blocking layer to remove the portion of said first current blocking layer at the bottom of the groove and portions of said first current blocking layer with said grating stripes as a dissolution mask whereby the width of the groove in said first current blocking layer changes periodically along the length of the groove; and successively epitaxially growing by liquid-phase epitaxy a second conductivity-type $Al_xGa_{(1-x)}As$ third cladding layer, filling the groove and covering said third current blocking layer, and a second conductivity-type GaAs contact layer on said third cladding layer.

4. The method of claim 1 including growing said active layer, said first current blocking layer, and said second current blocking layer to each have one of intrinsic and first and second conductivity-types.

5. The method of claim 2 including growing said active layer, said first current blocking layer, and said second current blocking layer to each have one of intrinsic and first and second conductivity-types.

6. The method of claim 3 including growing said active layer, said first current blocking layer, and said second current blocking layer to each have one of intrinsic and first and second conductivity-types.

* * * * *